(12) United States Patent
Andre et al.

(10) Patent No.: US 6,436,222 B1
(45) Date of Patent: Aug. 20, 2002

(54) FORMING PREFORMED IMAGES IN ORGANIC ELECTROLUMINESCENT DEVICES

(75) Inventors: James J. Andre, Rochester; Steven A. Van Slyke, Pittsford, both of NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 09/569,900

(22) Filed: May 12, 2000

(51) Int. Cl.[7] .................................................. H01J 1/62
(52) U.S. Cl. ............... 156/272.8; 156/292; 219/121.69; 313/504
(58) Field of Search ............................. 156/272.8, 292; 219/121.69; 313/504

(56) References Cited

U.S. PATENT DOCUMENTS

| | | | |
|---|---|---|---|
| 4,356,429 A | 10/1982 | Tang | |
| 4,539,507 A | 9/1985 | VanSlyke | |
| 4,769,292 A | 9/1988 | Tang et al. | |
| 5,728,994 A | * 3/1998 | Hutton | 219/121.69 |
| 6,137,221 A | * 10/2000 | Roitman et al. | 313/504 |
| 6,268,071 B1 | * 7/2001 | Yasukawa et al. | 313/504 |

* cited by examiner

Primary Examiner—Jeff H. Aftergut
(74) Attorney, Agent, or Firm—Raymond L. Owens

(57) ABSTRACT

A method of making a non-pixelated organic electroluminescent (EL) device with a preformed image includes the steps of forming a light-transmissive anode electrode over a light-transmissive substrate; forming an organic EL medium structure over the anode electrode; forming a cathode electrode over the organic EL medium structure and providing a cover structure over the device; and forming a preformed image in the cathode electrode by using a laser beam to remove cathode material imagewise from the cathode such that when a voltage is applied between the anode and cathode electrodes light will not be emitted from the device in areas corresponding to the preformed image, and the preformed image will be observable by a viewer as a dark image surrounded by a bright field of light emitted through the substrate.

6 Claims, 7 Drawing Sheets

FORMING PREFORMED IMAGES IN ORGANIC ELECTROLUMINESCENT DEVICES

FIELD OF THE INVENTION

The present invention relates to organic electroluminescent (EL) devices and, more particularly, to forming preformed images in such devices.

BACKGROUND OF THE INVENTION

Images are commonly printed on paper, fabric, ceramics and other substrate media that provide a mechanical and reflective/transmissive substrate for the handling and viewing of such images. These substrates often include a reflective surface as background that allow direct viewing of the images using ambient light or other forms of applied illumination. Transparency media such as slides or translucent display media require a lit backing or projecting system that illuminate the transparent media to either view directly (displays) or to project onto screens (slides). The use of the type of medium depends on the specific application, e.g. consumer images for home display, commercial billboards, lit advertising displays, and many others.

For either type of application, current media suffer a number of drawbacks. Reflective media require ambient illumination for viewing; a darkened living room for example, may not provide sufficient illumination levels for enjoyable viewing. Transparency media, on the other hand require the expense and additional bulk of light sources, view boxes, and associated subsystems.

For projection displays, supplemental screens, darkened rooms, and optical projection systems are normally required. Flat panel display technology has provided in some cases solutions to the illumination and bulk problem. Devices such as Liquid Crystal Displays (LCDs) are electronically controlled transparencies that when back illuminated with flat profile light sources provide an integrated and reasonably compact system to view pictorial and graphic content. Unfortunately, LCDs have problems with brightness, angle of viewing, and- although superior to the illuminated view box- are still bulky relative to a standard print on paper. Organic Light-Emitting Devices (OLEDs), also called organic electroluminescent (EL) devices, are self-illuminated display media that do not require supplementary illumination sources and hence are advantaged in compactness and power consumption. OLEDs are also Lambertian emitters and do not exhibit significant angle viewing problems. U.S. Pat. Nos. 4,356,429 and 4,539,507 describe OLED device configurations and materials. In order to depict pictorial and other types of content on LCDs, OLEDs and other flat panel display devices, x-y addressable electronic subsystems are required to apply controlled voltages across the display medium that are representative of the image being displayed. The x-y addressing voltage in the case of OLEDs, for example, controls the amount of current that flows through an organic light-emitting structure that produces light of color and brightness controlled by the chemical and physical characteristics of said layer. A multiplicity of colors can be achieved using OLED technology by chemical manipulation of the layers as taught in U.S. Pat. No. 4,769,292, for example. x-y image-wise address of the emissive layers can be achieved using a number of approaches. In the so-called passive matrix device orthogonal sets of electrodes are sequentially addressed in a line-by-line manner with voltage levels that correspond to the spatial image brightness desired at each specific position of the display device. In the active matrix configuration, a set of defined transistors usually defined onto single crystal silicon or glass (thin film transistors) are addressed and apply specific voltages across the display medium to control the brightness or transmissivity of the display medium.

There are many applications where it is desired to have preformed images in a display device. Although pixelated flat panel displays solve the illumination and bulk problem of traditional media, their cost is relatively high when providing preformed images and this is due primarily to the electronic interconnections and driving circuitry required. Flat panel displays are also limited to relatively small sizes due to the semiconductor processes used to fabricate them and cost issues that scale with display area. Although more flexible in their ability to display more selectable and changeable content than their traditional counterparts, cost and size issues make substitution of standard display applications using pixelated flat panel displays impractical when producing preformed images.

SUMMARY OF THE INVENTION

It is therefore an object of the present invention to effectively form preformed images in an organic electroluminescent (EL) device.

This object is achieved by a method of making an organic EL device with a preformed image, comprising the steps of:
 a) providing a light-transmissive substrate;
 b) providing a light-transmissive anode electrode over the substrate;
 c) forming an organic EL medium structure over the anode electrode;
 d) forming a cathode electrode over the organic EL medium structure and bonding a cover structure over the device; and
 f) using a laser beam to remove cathode material from the cathode electrode to form the preformed image, such that when a voltage is applied between the anode and cathode electrodes, light will not be emitted in areas corresponding to the removed cathode material and the preformed image will be observable by a viewer through the light-transmissive substrate.

ADVANTAGES

It is an advantage of the present invention that by removing cathode material in an organic EL display device, preformed images can be effectively formed and displayed. The device can be fabricated and fully covered or encapsulated and then the images can be formed by removing cathode material.

The present invention does not require complex wet chemistry processing to form preformed images in organic EL display devices. Moreover, complex masks and shadow masks are not required.

The drawings are necessarily of a schematic nature since the thickness of individual layers are too thin, and thickness differences of the various elements too great to permit depiction to scale or to permit convenient proportionate sealing. Additionally, for purposes of clarity, the drawings show a single organic electroluminescent (EL) medium structure which, in actual practice, can include several layers, for example, organic hole-injecting and hole- transporting layers, an organic light-emitting layer which may emit light of a single color or hue ("monochrome" El device), or which can emit one of red, green, or blue light (R,G,B) by appropriate doping of an organic light-emitting host material with a selected organic luminescent dopant material, and an organic electron-transporting layer. Alternatively, the organic EL medium structure can include one or more organic polymeric layers.

DETAILED DESCRIPTION OF THE INVENTION

Figure 1:
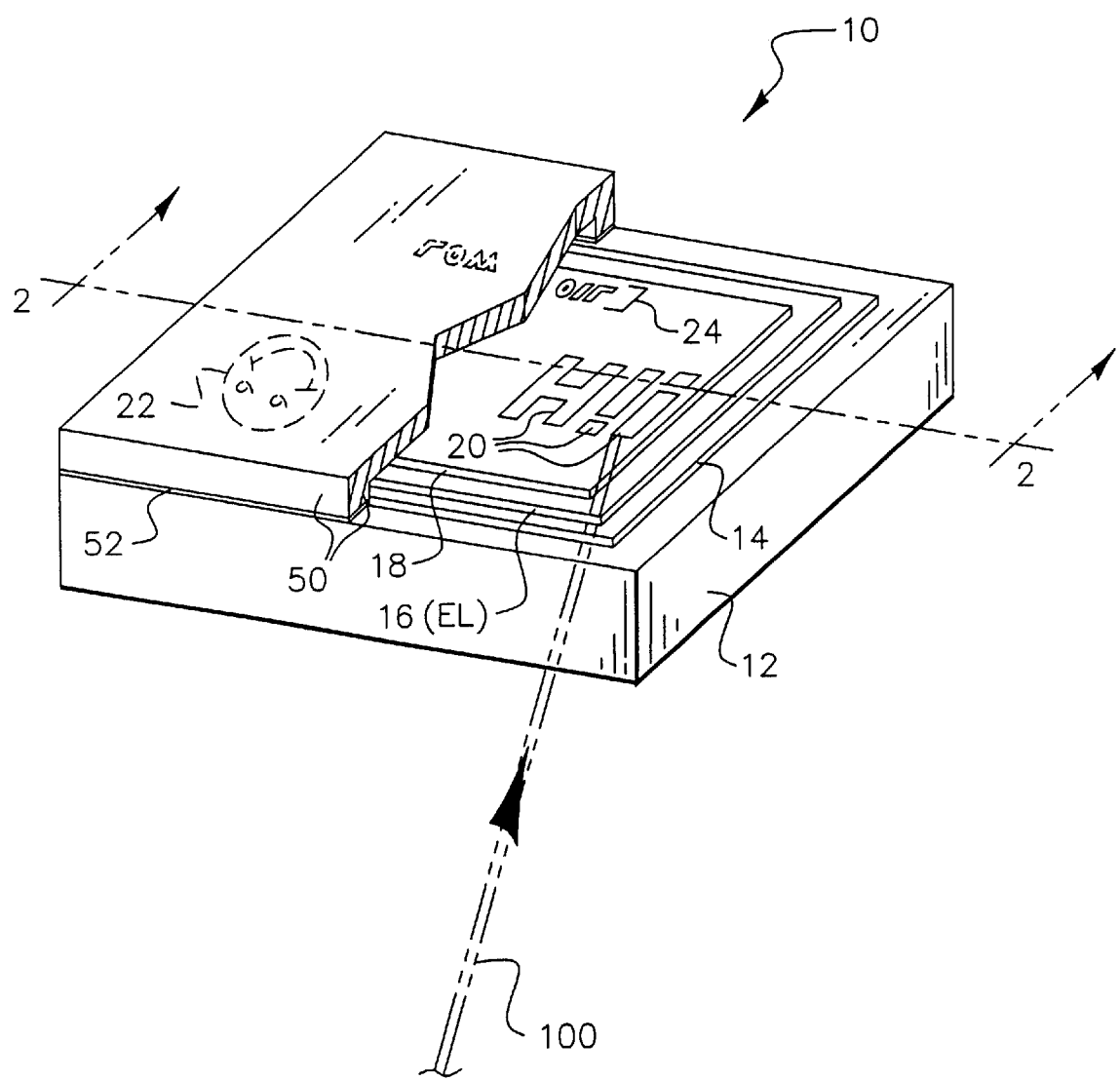
FIG. 1 is a schematic perspective view of an organic EL device having preformed images formed in a cathode electrode by a laser beam in accordance with the present invention.

FIG. 1 is a schematic perspective view of an organic EL device 10 having preformed images 20, 22, and 24 formed in a cathode electrode 18 by a laser beam 100. The device 10 has a light-transmissive substrate 12 over a surface of which are disposed in sequence a light-transmissive anode electrode 14, an organic EL medium structure 16, and the cathode electrode 18. A cover structure 50 is shown partially cut away to reveal the underlying device elements. The cover structure 50 is bonded to the substrate 12 with a cover seal 52 so as to protect the device. The cover structure 50 can be an encapsulation structure, and the cover structure 50 can include a desiccant for controlling the moisture level within the cover device.

The light-transmissive substrate 12 can be a rigid substrate such as, for example, a glass plate or a quartz plate and, alternatively, the light-transmissive substrate can be a rigid or flexible substrate made of a polymeric material.

The cover structure 50 can be optically opaque or it can be light-transmissive. Furthermore, the cover structure 50 can be a rigid structure or it can be a flexible encapsulation structure.

The light-transmissive anode electrode 14 can be formed from a number of well known light-transmissive materials such as, for example, indium tin oxide (ITO), or a chromium cermet material, such that the light-transmissive anode electrode 14 and the light-transmissive substrate 12 will permit viewing of light emitted by the device, including viewing preformed images which do not emit light, as well as providing for transmission of a laser light beam 100 which is used to form the preformed images in the cathode electrode 18.

The organic materials from which the organic EL medium structure 16 are formed can be selected from among materials, configuration of layers, and preferred layer thicknesses of conventional organic light-emitting devices such as those described by Tang, U.S. Pat. No. 4,356,429 and Van Slyke et al., U.S. Pat. No. 4,539,507 referred to previously.

The preformed images 20, 22, and 24 and the cathode electrode 18 are formed by using a laser beam having a laser beam intensity selected to remove cathode material image-wise from the cathode electrode 18 by an ablative process.

The preformed images can be pictorial images, text images, numerical images, symbols, or other indicia.

It will be appreciated that the organic EL device 10 does not have x-y-addressable pixels which are required in higher resolution devices. Rather the anode electrode 14, the organic EL medium structure 16, and the cathode electrode 18 are uniform layers which can be fabricated at significantly larger lateral dimensions than the pixel-based devices, since complex shadow masks are not required. The resolution, or the fine detail, of the preformed images 20, 22, and 24 is influenced by the degree to which a laser beam 100 can remove cathode material from the cathode electrode 18 in fine detail. In general, such preformed images are intended for display in relatively large-area devices. Accordingly, the preformed images are dimensionally scaled to the displayed area.

Figure 2:
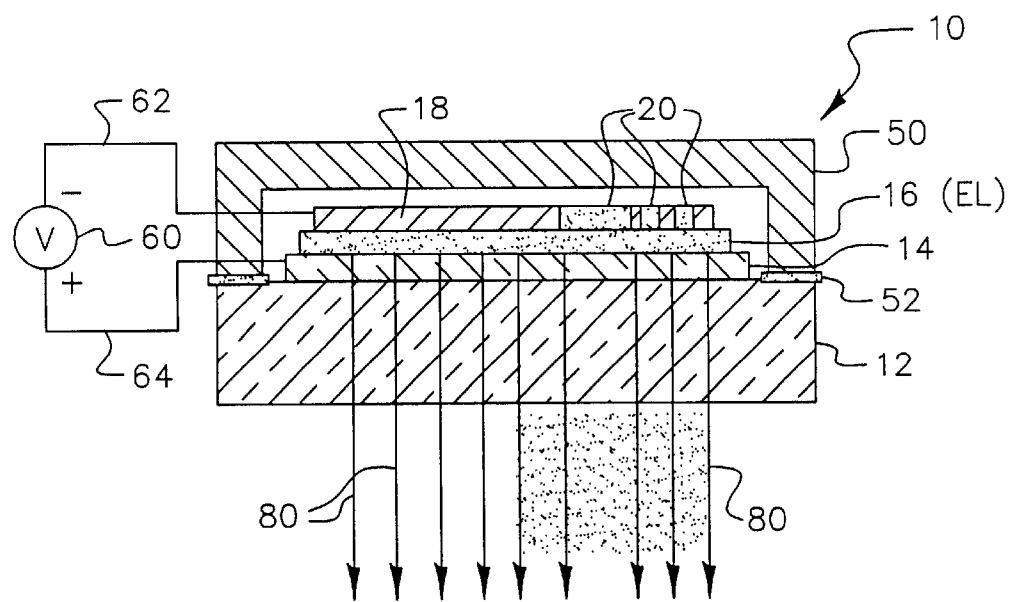
FIG. 2 is a schematic section view taken along the section lines 2—2 of the device of FIG. 1 and operative to produce light emission except in areas corresponding to the preformed image.

Turning to FIG. 2, a schematic section view of the organic EL device 10 is shown, taken along the section lines 2—2 of the device of FIG. 1.

Like parts and/or like functions are shown with like numeral designations and will, therefore, not require detailed description.

The organic EL device 10 is shown operative by applying an electrical potential from a drive voltage source 60 between the anode electrode 14 and the cathode electrode 18 such that a positive terminal is connected to the anode electrode 14 via an anode lead 64 and a negative terminal is connected to the cathode electrode by a cathode lead 62.

Under these electrical bias conditions, the "monochrome" organic EL medium structure 16 emits light of one particular color or hue which is transmitted through the light-transmissive anode 14 and the light-transmissive substrate 12 as emitted light 80 to a viewer, except that no light is emitted in areas corresponding to the preformed image 20 where the cathode material had been removed from the cathode electrode 18. Thus, the preformed image 20 will be readily visually discernible by a viewer as a dark image surrounded by a bright area of emitted light 80.

Figure 3:
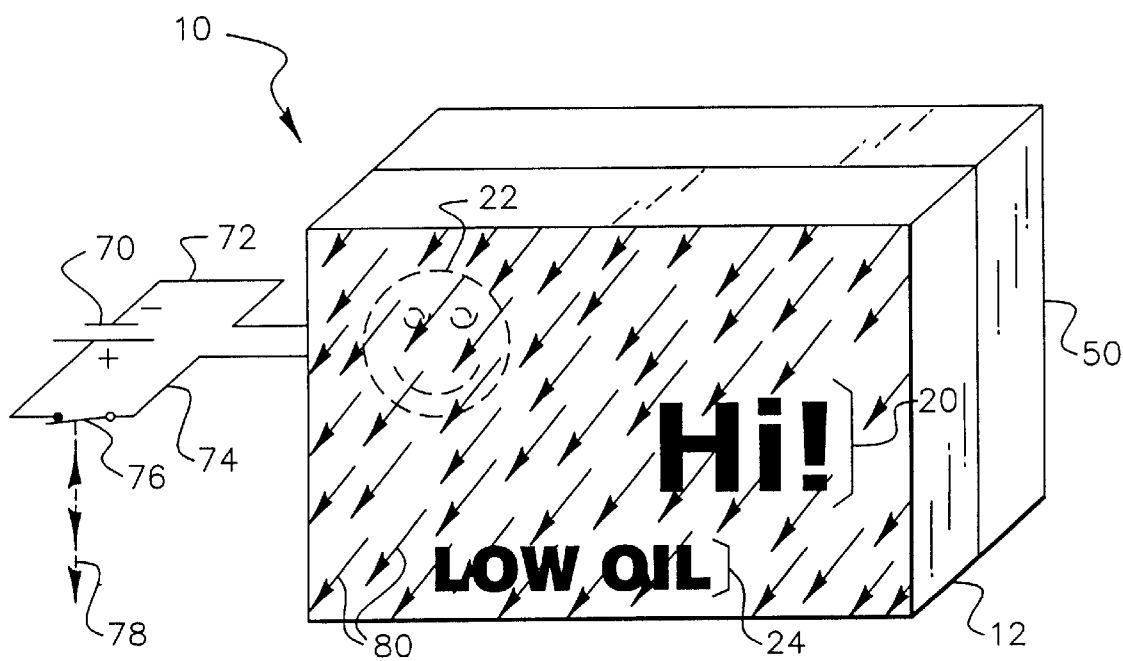
FIG. 3 is a schematic perspective view of a covered or encapsulated organic EL device operative to emit light except in areas of the preformed images in the cathode electrode (see FIG. 1)

Turning to FIG. 3, there is shown a schematic perspective view of the organic EL device 10 under operative conditions so as to display the preformed images 20, 22, and 24 which were preformed in the cathode electrode 18 of the device of FIG. 1. The organic EL device 10 is fully protected by the cover structure 50. A battery 70 provides the drive voltage applied between the anode and cathode electrodes (not shown) to generate emitted light 80 from the organic EL medium structure (see FIGS. 1 and 2), except that no light is emitted from areas corresponding to the preformed images. A negative terminal of the battery 70 is connected to the cathode electrode 18 by a cathode lead 72. The positive terminal of the battery 70 is connected via a switch or relay 76 (shown in a closed-contact position), and via an anode lead 74 to the anode electrode 14. The switch or relay 76 is shown schematically as being connected to an actuator 78. The actuator 78 may be a mechanical linkage or it may be an electrical connection to an oil monitor system of a car, in order to display the "LOW OIL" preformed image 24 (together with the preformed images 20 and 22) whenever an engine oil level falls below acceptable limits.

Figure 4:
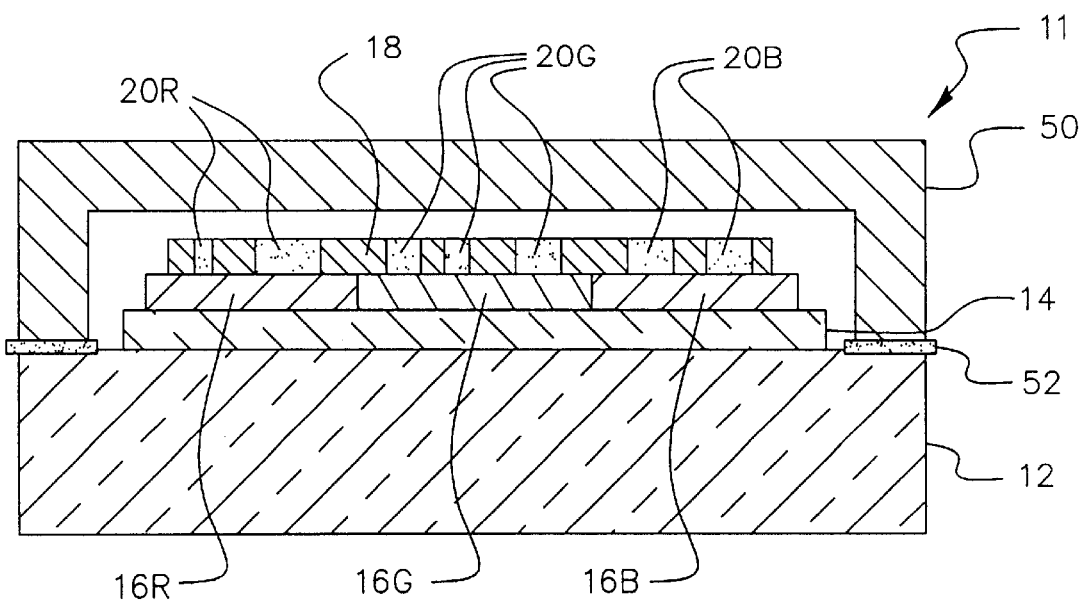
FIG. 4 is a schematic perspective view of a three-color (R,G,B) organic EL device having preformed images formed in a common cathode electrode in each of the R,G,B organic EL medium structures in accordance with the present invention.

FIG. 4 is a schematic section view of a three-color (R,G,B) organic EL device 11 which has preformed images 20R, 20G, and 20B formed over at least portions of a common cathode electrode 18, wherein these preformed images are overlaid on the corresponding EL medium structures 16R, 16G, and 16B. Since these three organic EL medium structures are disposed between a common anode electrode 14 and a common cathode electrode 18, all preformed images 20R, 20G, and 20B would be displayed to a viewer at the same time as dot images surrounded by red light emission (from 16R), green light emission (from 16G), and blue light emission (from 16B), respectively, when the device is operative by applying a voltage between the anode and cathode electrodes.

Figure 5:
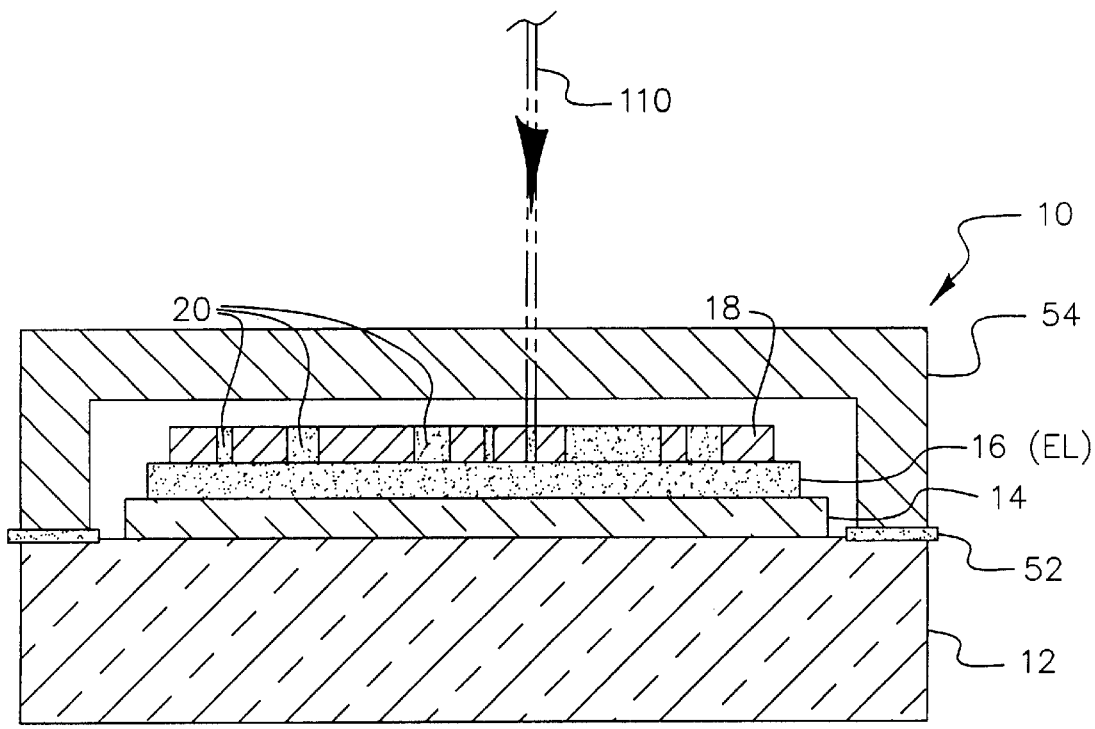
FIG. 5 is a schematic section view of an organic EL device having a light-transmissive cover through which a laser beam is directed to form preformed images in a cathode electrode in accordance with the present invention.

Turning to FIG. 5, there is depicted a schematic section view of an organic EL device 10 having a light-transmissive cover structure 54 through which a laser beam 110 can directly impinge on the cathode electrode 18 to remove cathode material therefrom imagewise to form the preformed image 20.

Figure 6:
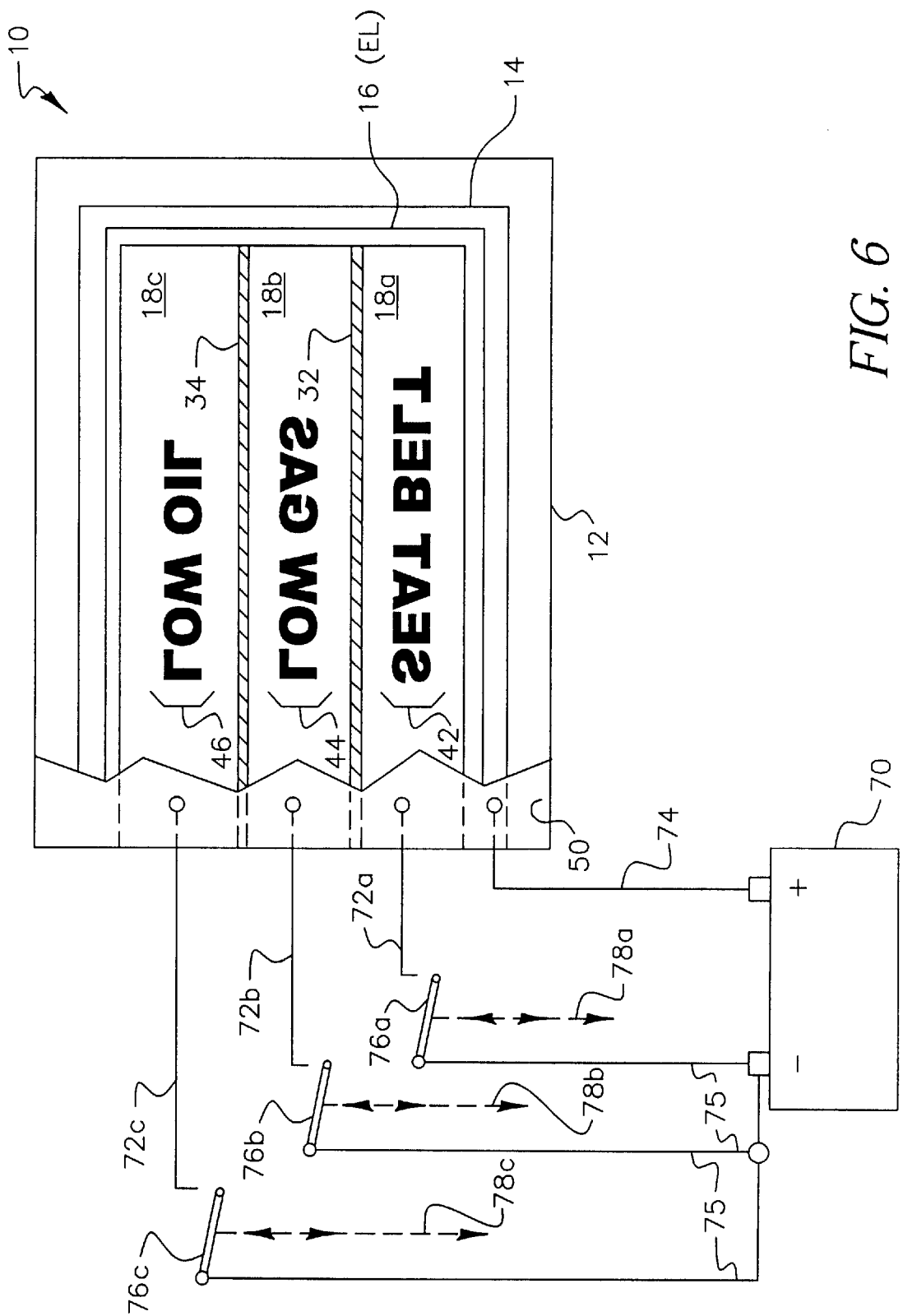
FIG. 6 is a schematic plan view of an organic EL device having preformed cathode electrode segments and preformed images in each cathode segment, and showing addressing means for selectably addressing the cathode electrode segments for displaying the preformed images therein, in accordance with the present invention.

Turning to FIG. 6, there is shown a schematic plan view of an organic EL device 10 having preformed cathode electrode segments 18a, 18b, and 18c, wherein the preformed cathode electrode segments are provided by preformed cathode segmentation lines 32, and 34. These segmentation lines can be formed by laser beam exposure to remove cathode material from a cathode 18 along the segmentation lines 32, 34 before or after forming preformed images 42, 44, and 46 by a laser beam ablative process as described above.

Figure 7:
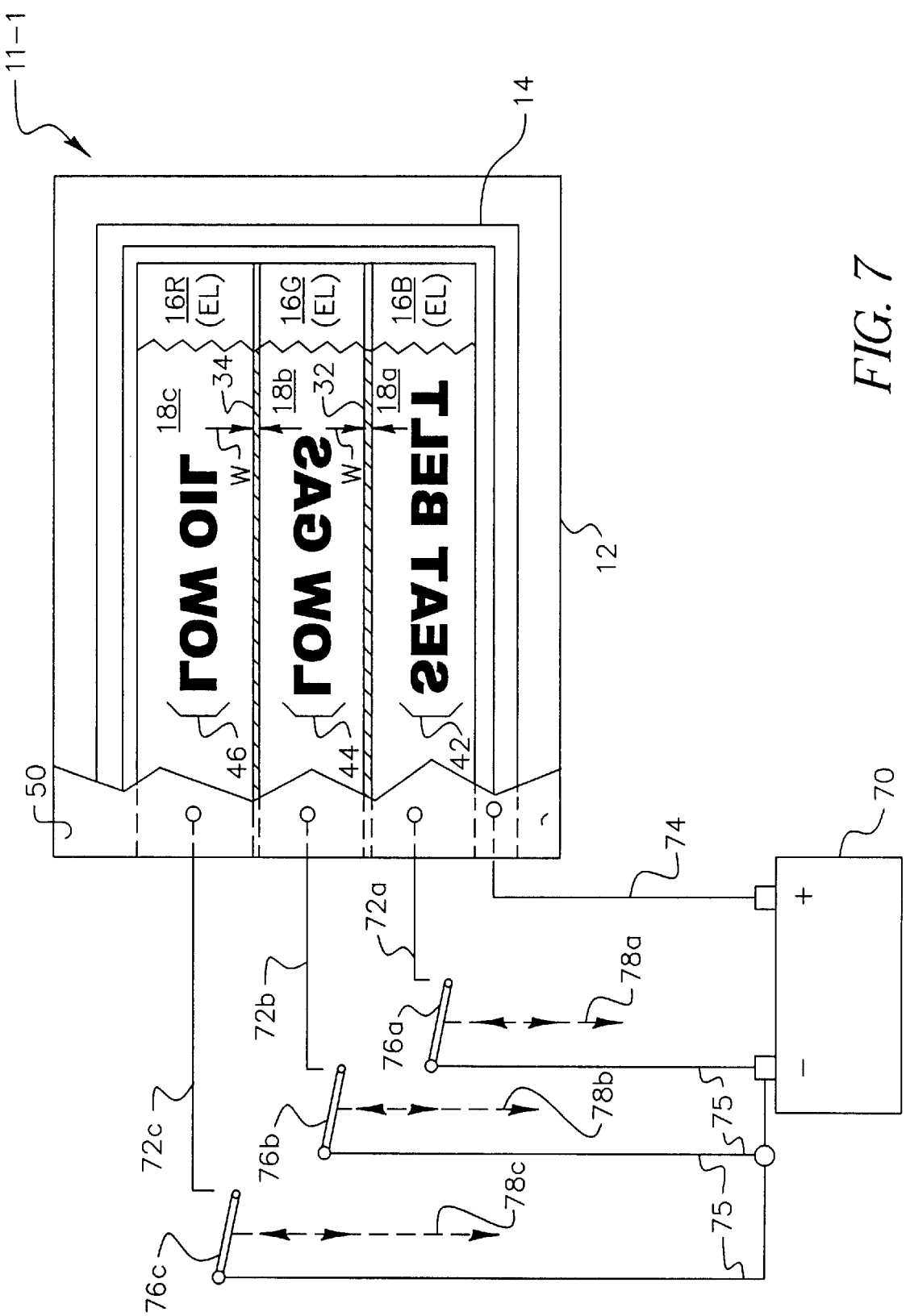
FIG. 7 is a schematic plan view of an organic EL device made in accordance with the present invention and having a three-color organic EL medium structure and overlying cathode electrode segments with preformed images.

Each of the cathode electrode segments 18a, 18b, and 18c (which are not pixels addressable in x and y directions) can be selectively connected to a negative terminal of a battery 70 via a common lead 75, respective switches or relays 76a, 76b, an 76c, and respective cathode leads 72a, 72b, and 72c. The positive terminal of battery 70 is connected to the anode electrode 14 via the anode lead 74. The switches or relays 76a, 76b, and 76c (shown in an open position) can be actuated by corresponding actuators 78a, 78b, and 78c. These actuators can be mechanical linkages or electrical connections to various monitor systems to drive actuating signals therefrom. For example, the actuators 78a, 78b, and 78c may be connected to a monitor systems of a car to display to a viewer the dark preformed image 42 ("SEAT BELT") and/or the dark preformed image 44 ("LOW GAS") and/or the dark preformed image 46 ("LOW OIL") through the light-transmissive substrate of the device 10. Each of the dark preformed images are surrounded by a bright field of emitted light (not shown) provided by the "monochrome" EL medium structure 16, as described previously. Referring to FIG. 7, there is shown a schematic plan view of an organic EL device 11-1 which combines the features of the cathode electrode segments 18a, 18b, and 18c as previously described with reference to FIG. 6 with a three-color organic EL medium structure which includes parallel laterally adjacent structures 16B, 16G, and 16R. For illustrative purposes only, these organic EL medium structures are shown laterally spaced. It will be appreciated that the organic EL medium structures can be abutting one another, or they can overlap by a distance which is equal to or smaller than a width dimension W of the cathode segmentation lines 32, 34.

The selectable application of a voltage between the anode electrode 14 and one, two or all three of the cathode electrode segments 18a, 18b, and 18c is identical to the description provided with reference to FIG. 6.

Chosen arbitrarily in FIG. 7 is the association of the preformed image 42 in the cathode electrode segment 18a with the blue light-emitting organic EL medium structure 16B. Similarly, the preformed image 44 of the cathode electrode segment 18b is shown associated with the green light-emitting organic EL medium structure 16G, and the preformed image 46 of the cathode electrode segment 18c is associated with the red light-emitting organic EL medium structure 16R. Accordingly, each one of the preformed images can be selectably displayed as dark images surrounded by a field of emitted blue light (16B), green light (16G), or red light (16R).

Depending on overall lateral dimensions of a display, and depending upon the number of preformed images or messages to be selectably viewed, the organic EL device 11-1 can have at least two cathode electrode segments with each of such segments associated with a congruent organic EL medium structure providing a different color or hue of emitted light. Alternatively, for relatively large-area devices such as, for example, advertising display devices, more than three cathode electrode segments may be preformed, and the R,G,B sequence of organic EL medium structures may be repeated or additional colors or hues of emitted light can be provided by appropriate doping of light-emitting organic host materials with selected luminescent dopant materials, as is well known in the art of color organic EL devices.

Figure 8:
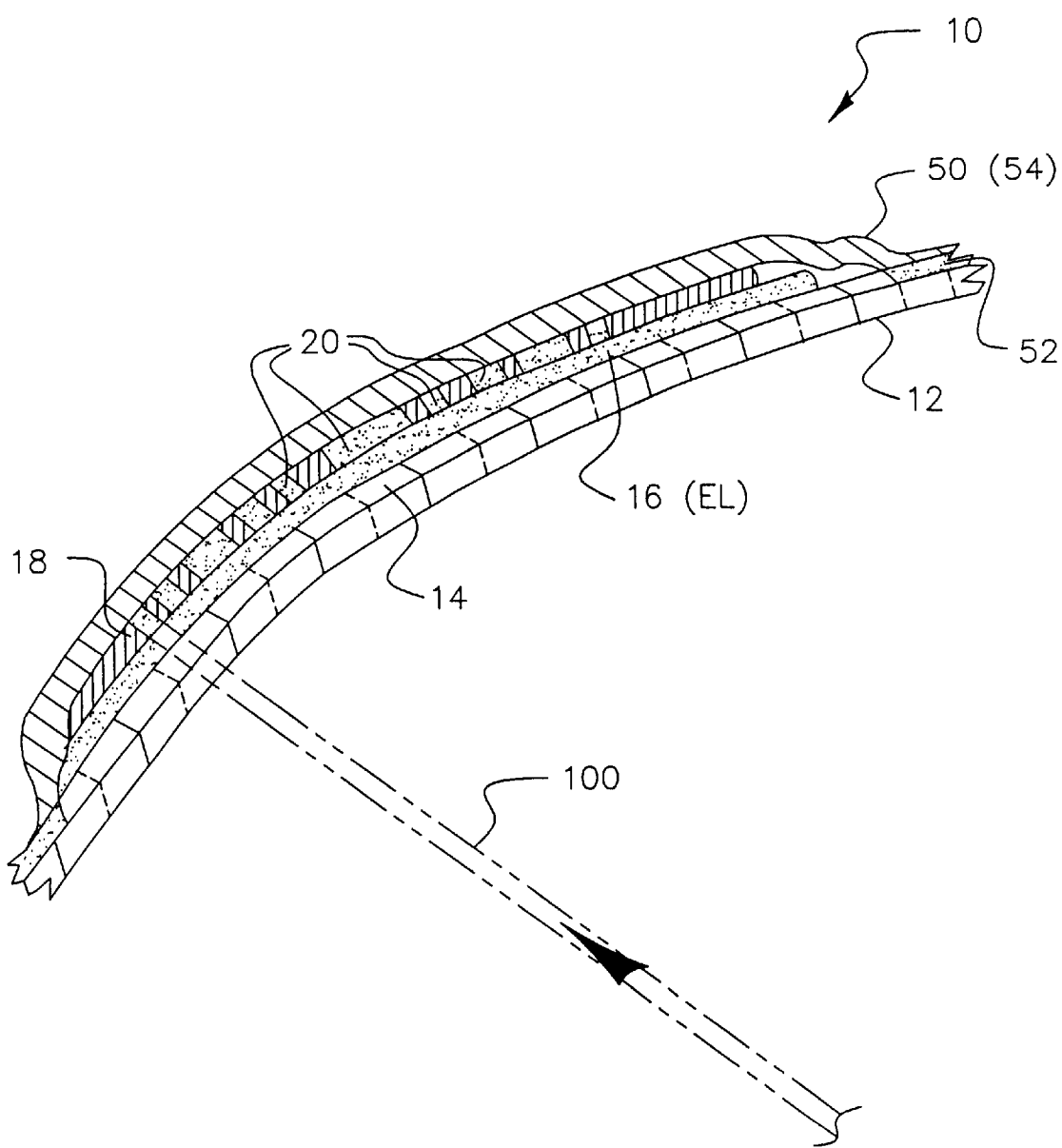
FIG. 8 is a schematic section view of an organic EL device having a flexible substrate and a flexible cover structure or encapsulation and including a preformed image in the cathode electrode, made in accordance with the present invention.

Turning now to FIG. 8, there is shown a schematic section view of an organic EL device 10 having a flexible substrate 12 and a flexible cover structure or encapsulation 50 which may be a light-transmissive cover structure 54. A laser light beam 100 is shown incident on the cathode electrode 18 through the substrate 12 and the light-transmissive anode electrode 14 to remove cathode material imagewise from the cathode 18 so as to form the preformed image 20 in the cathode.

As described previously, the flexible substrate 12 can be a polymeric substrate, and the flexible cover structure 50 (54) can be a flexible encapsulation structure. The cover structure 50 (54) seals the device against a surface of the substrate 12 by a cover seal 52.

Figure 9:
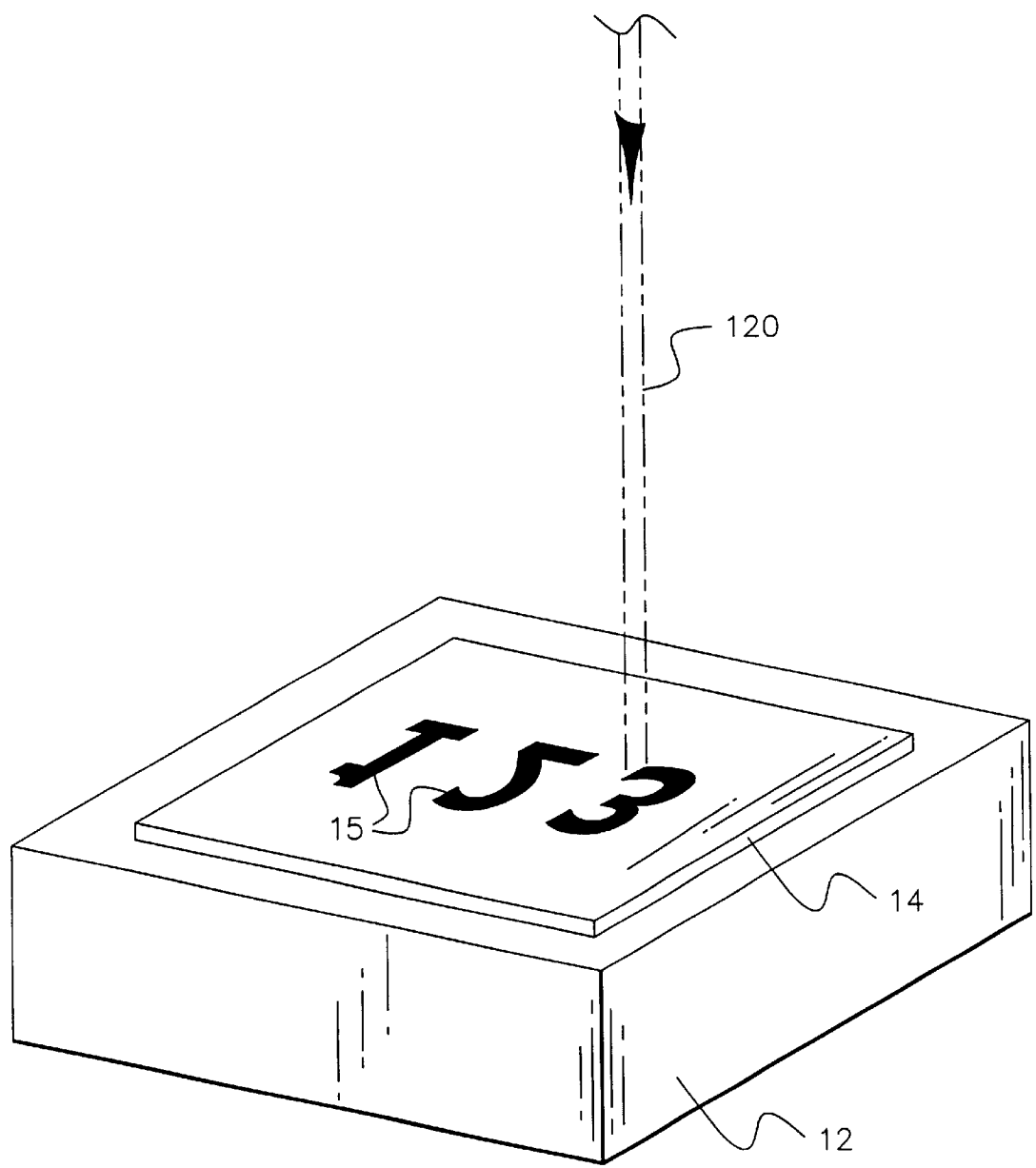
FIG. 9 is a schematic perspective view of an anode electrode disposed over a substrate and a preformed image being formed in the anode electrode by a laser beam in accordance with another aspect of the present invention.

Referring now to FIG. 9, there is shown a schematic perspective view of an anode electrode 14 disposed over a substrate 12, and a preformed image 15 is formed in the anode electrode 14 by a laser beam 120. An organic EL medium structure such as, for example, the organic EL medium structure 16, would then be formed over the anode electrode having the preformed image 15 therein, and a cathode electrode would be formed over the organic EL medium structure as described above.

With respect to using a laser beam for forming preformed images in accordance with the present invention, the device which is to receive the preformed image in the cathode electrode (or the substrate 12 having the anode electrode 14 to receive a preformed image 15) can be held in a stationary position if a laser beam recording system provides for deflecting or scanning a laser beam in x and y directions in a controllable manner. Alternatively, if a non-scanned laser beam is used to form the preformed image or images, an organic EL device (or the substrate 12 of FIG. 9) is positioned on an x-y translatable stage, which can be programmably translated in correspondence with the images to be preformed.

The invention has been described in detail with particular reference to certain preferred embodiments thereof, but it will be understood that variations and modifications can be effected within the spirit and scope of the invention.

PARTS LIST

| | |
|---|---|
| 10 | monochrome organic EL device |
| 11 | three-color (R, G, B) organic EL device |
| 11-1 | three-color (R, G, B) organic EL device with cathode electrode segments. |
| 12 | light-transmissive substrate |
| 14 | light-transmissive anode electrode |
| 15 | preformed image in anode electrode |
| 16 | monochrome organic EL medium structure |
| 16R | red light-emitting organic EL medium structure |
| 16G | green light-emitting organic EL medium structure |
| 16B | blue light-emitting organic EL medium structure |
| 18 | cathode electrode |
| 18a | cathode electrode segment |
| 18b | cathode electrode segment |
| 18c | cathode electrode segment |
| 20 | preformed image in cathode electrode (monochrome EL) |
| 20R | preformed image in cathode electrode (overlying R EL) |
| 20G | preformed image in cathode electrode (overlying G EL) |
| 20B | preformed image in cathode electrode (overlying B EL) |
| 22 | preformed image in cathode electrode (monochrome EL) |
| 24 | preformed image in cathode electrode (monochrome EL) |
| 32 | preformed cathode segmentation line |
| 34 | preformed cathode segmentation line |
| 42 | preformed image in cathode electrode (monochrome EL) |
| 44 | preformed image in cathode electrode (monochrome EL) |
| 46 | preformed image in cathode electrode (monochrome EL) |
| 50 | opaque cover structure |
| 52 | cover seal |
| 54 | light-transmissive cover structure |
| 60 | drive voltage source |
| 62 | cathode lead |
| 64 | anode lead |
| 70 | battery |
| 72 | cathode lead |
| 72a | cathode lead (cathode segment 18a) |
| 72b | cathode lead (cathode segment 18b) |
| 72c | cathode lead (cathode segment 18c) |
| 74 | anode lead |
| 75 | common leads to negative terminal of battery 70 |
| 76 | switch or relay |
| 76a | switch or relay (cathode segment 18a) |
| 76b | switch or relay (cathode segment 18b) |
| 76c | switch or relay (cathode segment 18c) |
| 78 | actuator |
| 78a | actuator (cathode segment 18a) |
| 78b | actuator (cathode segment 18b) |
| 78c | actuator (cathode segment 18c) |
| 80 | emitted light (monochrome EL medium structure) |
| 100 | laser beam for cathode ablation through substrate |
| 110 | laser beam for cathode ablation through cover |
| 120 | laser beam for anode ablation |
| W | width dimension of a preformed cathode segmentation line (32, 34) |

What is claimed is:

1. A method of making an organic (EL) device with a preformed image including text or pictorial information, comprising the steps of:

a) providing a light-transmissive substrate;

b) providing a light-transmissive anode electrode over the substrate;

c) forming an organic EL medium structure over the anode electrode;

d) forming a cathode electrode over the organic EL medium structure and bonding a light-transmissive cover structure over the organic EL device; and e) directing a laser beam through the light-transmissive cover structure directly to impinge upon the cathode electrode to remove cathode material from the cathode electrode to form the preformed image, such that when a voltage is applied between the anode and cathode electrodes, light will not be emitted in areas corresponding to the removed cathode material and the preformed image will be observable by a viewer through the light-transmissive substrate.

2. The method of claim 1 wherein the substrate providing step includes providing a rigid light-transmissive substrate and the cover structure bonding step includes bonding a rigid cover structure over the device.

3. The method of claim 1 wherein the substrate providing step includes providing a flexible light-transmissive substrate and the cover structure bonding step includes bonding a flexible light-transmissive cover structure over the device.

4. The method of claim 1 wherein the organic EL medium structure forming step includes forming a monochrome light-emitting organic EL medium structure.

5. The method of claim 1 wherein the organic EL medium structure forming step includes forming a monochrome light-emitting organic EL medium structure providing at least one designated area for emitting light of a first color and at least one designated area for emitting light of a second color, and forming at least one preformed image in the cathode electrode in each of the designated areas.

6. A method of making an organic (EL) device with a preformed image including text or pictorial information, comprising the steps of:

a) providing a light-transmissive substrate;

b) providing a light-transmissive anode electrode over the substrate;

c) using a laser beam to remove anode material from an anode electrode to form the preformed image prior to forming the organic EL medium structure, the cathode electrode and the cover structure;

d) forming an organic EL medium structure over the anode electrode; and e) forming a cathode electrode over the organic EL medium structure and bonding a cover structure over the organic EL device such that when a voltage is applied between the anode and cathode electrodes, light will not be emitted in areas corresponding to the removed anode material and the preformed image will be observable by a viewer through the light-transmissive substrate.

* * * * *